US010067427B2

(12) United States Patent
Kawahara

(10) Patent No.: US 10,067,427 B2
(45) Date of Patent: Sep. 4, 2018

(54) HOLDING DEVICE, HOLDING METHOD, LITHOGRAPHY APPARATUS, AND ARTICLE MANUFACTURING METHOD

(71) Applicant: CANON KABUSHIKI KAISHA, Tokyo (JP)

(72) Inventor: Atsushi Kawahara, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/466,907

(22) Filed: Mar. 23, 2017

(65) Prior Publication Data

US 2017/0277039 A1 Sep. 28, 2017

(30) Foreign Application Priority Data

Mar. 25, 2016 (JP) .................................. 2016-061983

(51) Int. Cl.
  *G03B 27/32* (2006.01)
  *G03B 27/58* (2006.01)
  *G03F 7/20* (2006.01)

(52) U.S. Cl.
  CPC ............ *G03F 7/707* (2013.01); *G03F 7/7085* (2013.01)

(58) Field of Classification Search
  CPC .... G03F 7/70691; G03F 7/707; G03F 7/7085; H01L 21/6838
  USPC .................................. 355/72, 73, 75, 76, 77
  See application file for complete search history.

(56) References Cited

U.S. PATENT DOCUMENTS

| | | | | |
|---|---|---|---|---|
| 5,191,218 A | * | 3/1993 | Mori | ....................... G03F 7/707 250/453.11 |
| 5,564,682 A | * | 10/1996 | Tsuji | ..................... B25B 11/005 269/21 |
| 6,446,948 B1 | * | 9/2002 | Allen | .................... B25B 11/005 118/500 |

(Continued)

FOREIGN PATENT DOCUMENTS

| | | |
|---|---|---|
| JP | H0980404 A | 3/1997 |
| JP | H1167882 A | 3/1999 |
| WO | 2015169616 A1 | 11/2015 |

OTHER PUBLICATIONS

Extended European Search Report issued in European Appln. No. 17000433.7 dated Nov. 16, 2017.

*Primary Examiner* — Colin Kreutzer
(74) *Attorney, Agent, or Firm* — Rossi, Kimms & McDowell LLP

(57) ABSTRACT

Provided is a holding device for vacuum-attracting and holding a substrate, the device comprising: an attracting unit configured to have attraction mechanisms; and a control unit configured to control the attracting unit, wherein the control unit is configured: to acquire a sequence for attracting the substrate and reference data for determining whether the substrate has been successfully attracted, from time-dependent variation in pressure in an attraction mechanism in a case where the substrate is held by the attraction mechanisms; to control the attracting unit to hold a first substrate based on the sequence and to acquire measurement data that indicates time-dependent variation in pressure in the attraction mechanism in a case where the first substrate is held; and to compare the reference data and the measurement data, and to control the attracting unit to hold a second substrate based on the sequence if a comparison result satisfies a predetermined condition.

16 Claims, 11 Drawing Sheets

(56) References Cited

U.S. PATENT DOCUMENTS

| | | |
|---|---|---|
| 2011/0086298 A1 | 4/2011 | Endo |
| 2013/0025114 A1* | 1/2013 | Mizubata ............ H01L 21/6838 29/559 |
| 2015/0109600 A1* | 4/2015 | Mizumoto .............. G03F 7/707 355/73 |
| 2016/0239600 A1* | 8/2016 | Tsai ........................ G03F 7/707 |
| 2017/0192359 A1 | 7/2017 | Leenders et al. |

* cited by examiner

HOLDING DEVICE, HOLDING METHOD, LITHOGRAPHY APPARATUS, AND ARTICLE MANUFACTURING METHOD

BACKGROUND OF THE INVENTION

Field of the Invention

The present invention relates to a holding device, a holding method, a lithography apparatus, and an article manufacturing method.

Description of the Related Art

In holding a substrate used in a lithography apparatus for manufacturing semiconductor devices and the like, there has been the demand for technology in which the substrate having a larger warp or larger deformation is held with satisfactory flatness. A method for holding the substrate includes a method in which the back surface of the substrate is vacuum-attracted. In this method, there is the case where the substrate cannot be well-attracted due to escaping attraction air because of the warp of the substrate or the like. Thus, there is technology in which area for attraction is divided into attraction regions and the timing of the attraction is adjusted for the divided attraction regions (Japanese Patent Laid-Open No. H09-080404 and Japanese Patent Laid-Open No. H11-067882).

However, the technologies disclosed in Japanese Patent Laid-Open No. H09-080404 and Japanese Patent Laid-Open No. H11-067882 may have a difficulty in handling a substrate that has a complex shape (such as a warped shape) since the attraction sequence for each of the divided attraction regions is specified.

SUMMARY OF THE INVENTION

In view of the foregoing, the present invention provides, for example, a holding device which is advantageous in holding a substrate that has a complex shape.

According to an aspect of the present invention, a holding device for vacuum-attracting and holding a substrate is provided, the holding device comprising: an attracting unit configured to have attraction mechanisms; and a control unit configured to control the attracting unit, wherein the control unit is configured: to acquire a sequence for attracting the substrate and reference data for determining whether the substrate has been successfully attracted, from time-dependent variation in pressure in an attraction mechanism in a case where the substrate is held by the attraction mechanisms; to control the attracting unit to hold a first substrate based on the sequence and to acquire measurement data that indicates time-dependent variation in pressure in the attraction mechanism in a case where the first substrate is held; and to compare the reference data and the measurement data, and to control the attracting unit to hold a second substrate based on the sequence if a comparison result satisfies a predetermined condition.

Further features of the present invention will become apparent from the following description of exemplary embodiments with reference to the attached drawings.

DESCRIPTION OF THE EMBODIMENTS

Hereinafter, embodiments of the present invention will be described with reference to the drawings.

First Embodiment

Figure 1:
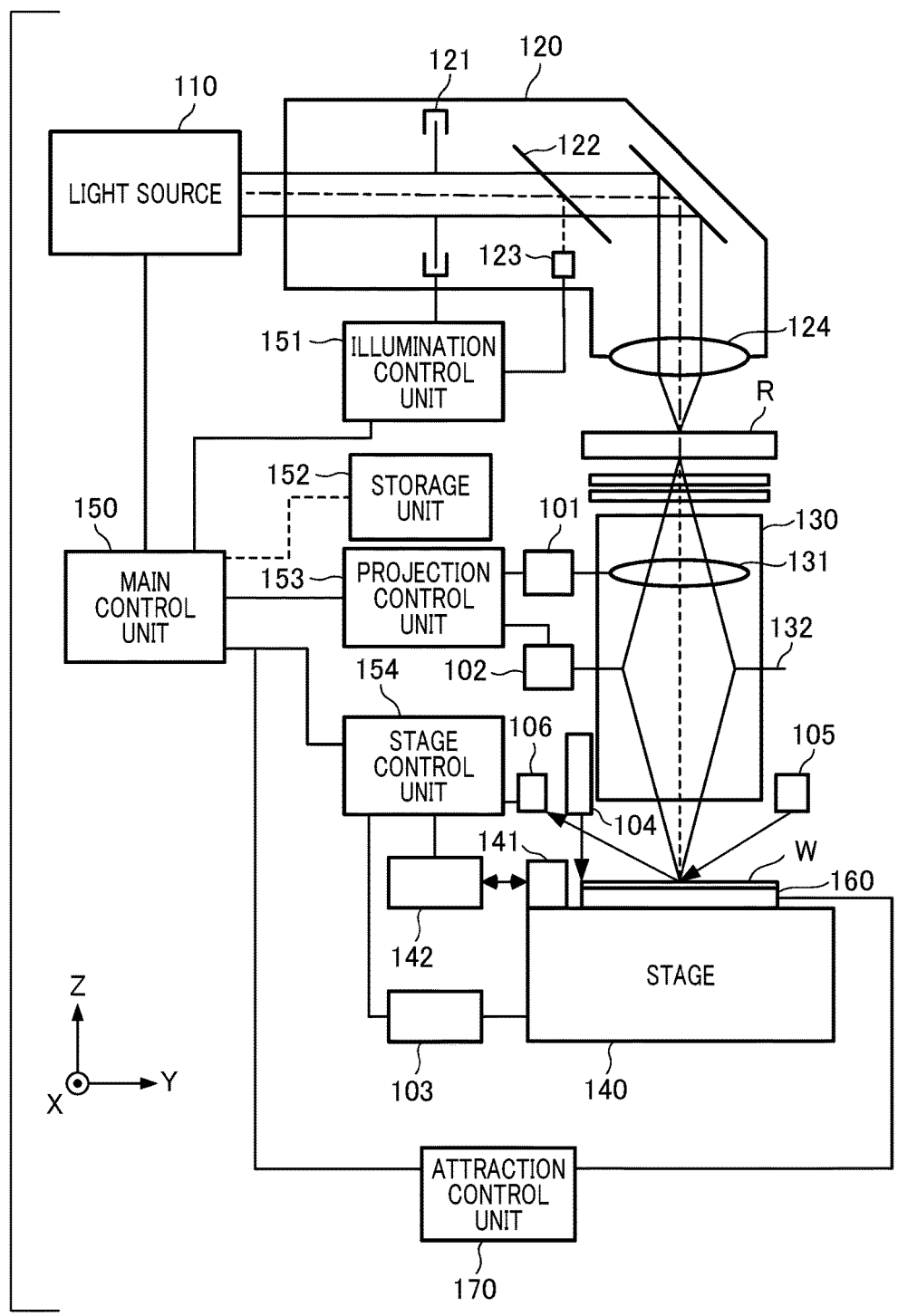
FIG. 1 is a perspective view of an exposure apparatus which comprises a holding device according to a first embodiment.

FIG. 1 is a perspective view of an exposure apparatus which comprises a holding device according to a first embodiment of the present invention. Although this holding device is applicable to other lithography apparatuses (for example, an imprint apparatus), in the present embodiment, a description will be given of an example in which this holding device is applied to the exposure apparatus. The exposure apparatus that comprises the holding device according to the present embodiment includes a light source 110, an illumination optical system 120, a projection optical system 130, a stage 140, and a main control unit (control unit) 150. In addition, the holding device according to the present embodiment includes an attracting unit 160 and an attraction control unit 170. In the following drawings, a Z axis is set as a direction of an optical axis of the projection optical system 130 and a X-Y plane is set as a plane perpendicular to the Z axis.

The light source 110 outputs light in a plurality of wavelength bands as exposure light. The illumination optical system 120 includes a light shielding plate 121, a half mirror 122, a photosensor 123, a mirror 124, a shaping optical system (not shown), and an optical integrator (not shown). Light emitted by the light source 110 is shaped into a predetermined beam shape through the shaping optical system of the illumination optical system 120. Further, the shaped beam is incident to the optical integrator. The optical integrator forms a large number of secondary light sources that illuminate a reticle (original) R with a uniform illuminance distribution. The reticle R is also referred to as a "mask" and the circuit pattern of a semiconductor device to be printed is formed on the surface of this reticle R. The light shielding plate 121 is positioned in an optical path of the illumination optical system 120 and forms any illumination area on the reticle R. The half mirror 122 is positioned in the optical path of the illumination optical system 120 and a part of the exposure light for illuminating the reticle R is reflected and extracted by this half mirror 122. The photosensor 123 is positioned in the optical path of the reflected light that has been reflected by the half mirror 122 and outputs a signal corresponding to the intensity (exposure energy) of the exposure light to a control unit (illumination control unit) 151 for the illumination optical system 120. The control unit 151 for the illumination optical system 120 controls the light shielding plate 121 and the like based on this output by the photosensor 123.

The projection optical system 130 of a refractive type, a catadioptric system, or the like projects a circuit pattern image of the reticle R at a reduction magnification β (for example, β=1/2), and is positioned to form the image in a shot region on a substrate (wafer) W on which a photoresist is coated. The projection optical system 130 includes an optical element 131 and an aperture stop 132. The optical element 131 is moved on the optical axis of the projection optical system 130 by a driving unit 101. This keeps the projection magnification at a satisfactory value for reducing a distortion error while preventing various aberrations of the projection optical system 130 from increasing. The aperture stop 132 is positioned on a pupil plane (a Fourier transform plane for the reticle R) of the projection optical system 130. The aperture stop 132 has an almost circular opening portion with a diameter controlled by a driving unit 102. The driving units 101 and 102 are controlled by a control unit (projection control unit) 153 of the projection optical system 130.

The stage 140 is controlled by a driving unit 103 with respect to 6 degrees of freedom and may perform the alignment of the substrate W. Note that the 6 degrees of freedom includes a degree of translation freedom along each axis in an X-Y-Z coordinate system and a degree of rotary freedom around each axis. A laser interferometer 142 measures a distance to a moving mirror 141 that is fixed to the stage 140, thereby measuring the position of the stage 140 on the X-Y plane. A positional relationship between the stage 140 and the substrate W is measured by an alignment measurement system 104. A focus shift of the substrate W is measured by a focus plane detector including a light projecting optical system 105 and a detection optical system 106. The light projecting optical system 105 projects a plurality of light beams formed by non-exposure light to which the photoresist on the substrate W is not sensitive, and each light beam is focused on and reflected by the substrate W. The light beam reflected by the substrate W is incident to the detection optical system 106. A plurality of light receiving elements for position detection is positioned in correspondence with the respective reflected light beams within the detection optical system 106. The detection optical system 106 is configured so that the light receiving surface of each light receiving element is nearly conjugate with the reflection point of each light beam on the substrate W by an image optical system. The focus shift is measured as a positional shift of a light beam incident to the light receiving elements within the detection optical system 106. The driving unit 103 is controlled by a stage control unit 154 under each measurement result. The driving units 101 to 103 are driving parts such as motors.

The attracting unit 160 holds the substrate W in the stage 140 with vacuum attraction under the control by the attraction control unit 170. The main control unit 150 integrally controls the control unit 151 for the illumination optical system 120, the control unit 153 for the projection optical system 130, the stage control unit 154, and the attraction control unit 170.

Figure 2A:
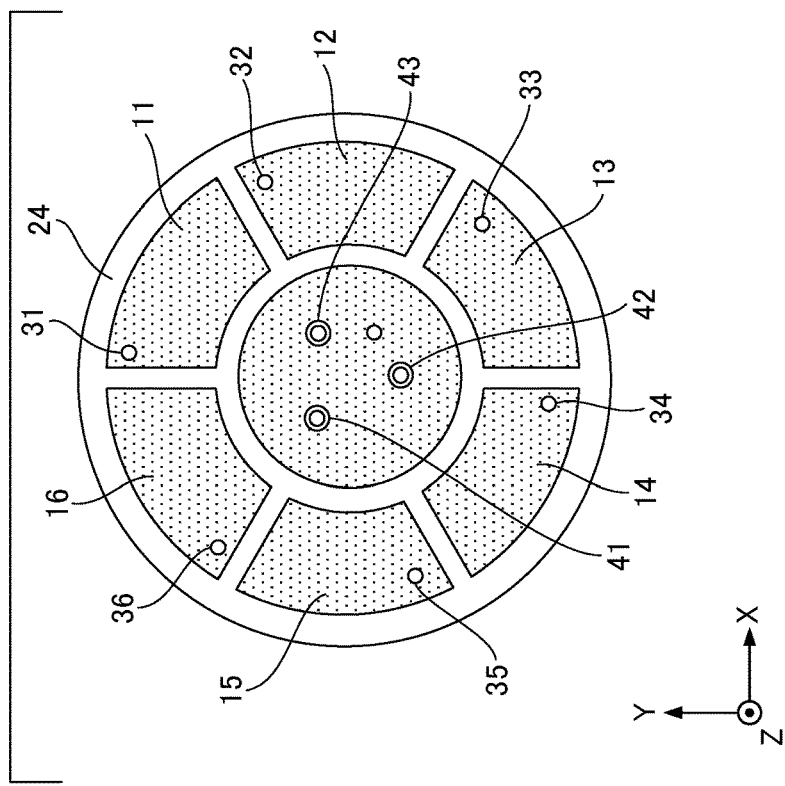
FIGS. 2A and 2B illustrate mutually different types of attracting units when viewed from above.
Figure 2B:
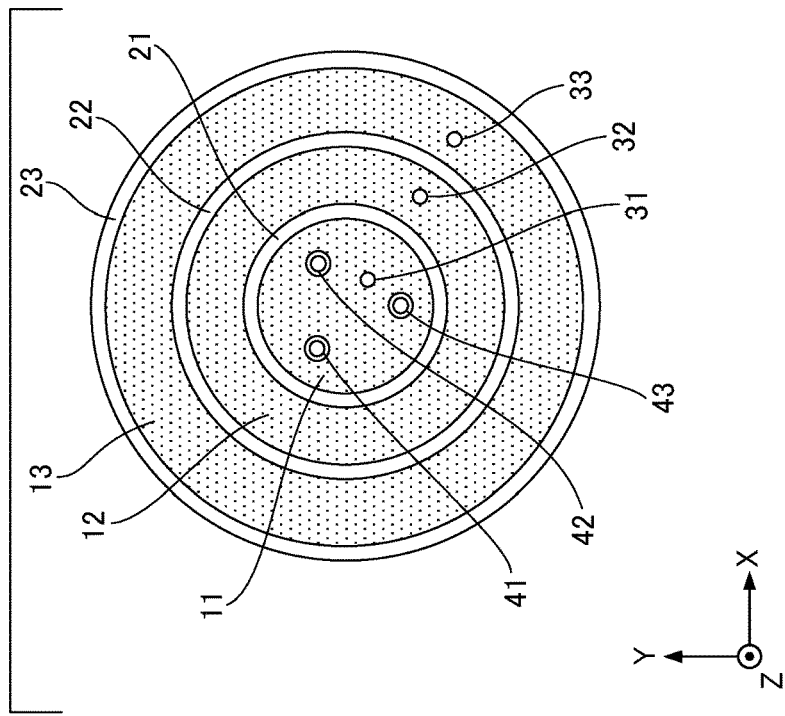

FIGS. 2A and 2B illustrate two types of attracting units 160 when viewed from above, respectively. FIG. 2A illustrates the attracting unit suitable for attracting an upward-wrapped substrate or a downward-wrapped substrate. In this regard, the upward-wrapped substrate is referred to as a substrate having a surface in which there is a point at the largest coordinate in the direction of the optical axis (Z axis) when viewed from any direction within the X-Y plane. In contrast, the downward-wrapped substrate is referred to as a substrate having a surface in which there is a point at the smallest coordinate. FIG. 2B illustrates the attracting unit suitable for attracting a saddle-shaped wrapped substrate. In this regard, the saddle-shaped wrapped substrate is referred to as a substrate having a surface in which there is a so-called saddle point that is at the largest coordinate in the direction of the optical axis (Z axis) when viewed from one direction in the X-Y plane, and is at the smallest coordinate when viewed from another direction. The attracting unit 160 shown in FIG. 2A comprises vacuum attraction regions 11 to 13 demarcated by borders 21 to 23, discharging ports 31 to 33 for discharging air taken in from the vacuum attraction regions 11 to 13, and wafer delivery pin entry ports 41 to 43. In this attracting unit 160, an area for attraction is divided concentrically into the vacuum attraction regions 11 to 13. The attracting unit 160 shown in FIG. 2B comprises vacuum attraction regions 11 to 16 demarcated by a border 24, discharging ports 31 to 36 for discharging air taken in from the vacuum attraction regions 11 to 16, and wafer delivery pin entry ports 41 to 43. In this attracting unit 160, an area for attraction is divided radially into the vacuum attraction regions 11 to 16. The wafer delivery pin entry ports 41 to 43 are openings where a wafer delivery pin 107 shown in FIG. 3 move up and down in the delivery of the substrate W to/from a substrate conveying hand (not shown). The substrate conveying hand positions the substrate W on the wafer delivery pin 107 that is moved up from the wafer delivery pin entry ports 41 to 43. After the substrate conveying hand is retracted, the wafer delivery pin 107 moves down into the wafer delivery pin entry ports 41 to 43 to place the substrate W on the attracting unit 160.

Figure 3:
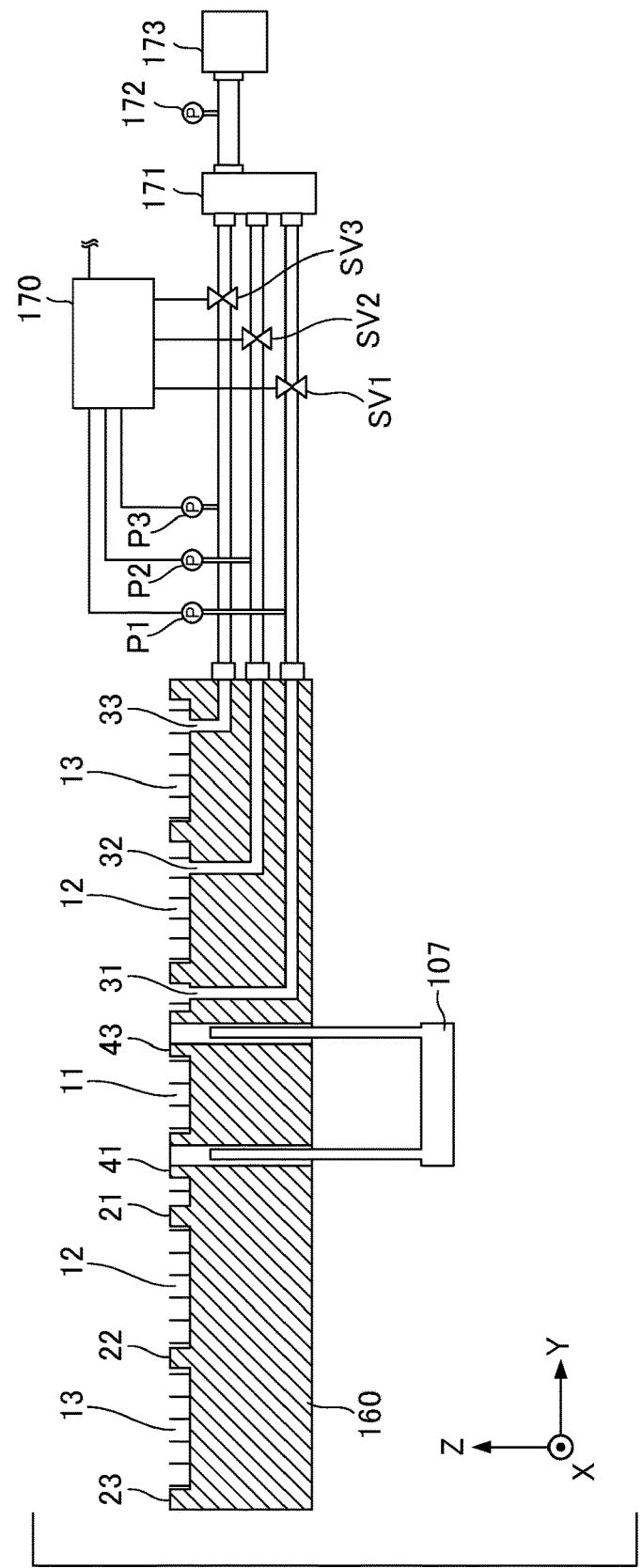
FIG. 3 is a general view of the holding device including the attracting unit shown in FIG. 2A.

FIG. 3 is a general view of the holding device including the attracting unit 160 shown in FIG. 2A. The vacuum attraction regions 11 to 13 are filled with a large number of small protrusions for supporting the substrate W in the vacuum attraction. The discharging ports 31 to 33 are connected to solenoid valves SV1 to SV3 via pipes. The solenoid valves SV1 to SV3 are connected to a vacuum pump 173 via a manifold 171 for branching pipe. Pressure sensors P1 to P3 are provided in pipes connected to each of the discharging ports 31 to 33. The pressure sensors P1 to P3 measure pressure in the vacuum attraction regions 11 to 13. Each pressure indicates the vacuum degree (attraction force) of the attraction mechanism including the vacuum attraction region, the discharging port, the pipe, the solenoid valve, and the manifold, and the vacuum pump. The pressure sensor P1 measures the vacuum degree of the attraction mechanism including the vacuum attraction region 11. The pressure sensor P2 measures the vacuum degree of the attraction mechanism including the vacuum attraction region 12. The pressure sensor P3 measures the vacuum degree of the attraction mechanism including the vacuum attraction region 13. A source pressure sensor 172 measures source pressure in the vacuum pump 173. The attraction control unit 170 controls the solenoid valves SV1 to SV3 based on values measured by the pressure sensors P1 to P3 to cause the attracting unit 160 to vacuum-attract the substrate W. Note that the pressure sensors for measuring pressure in each vacuum attraction region may be positioned in a required minimum pipe system, not but in the entire pipe system.

Figure 4:
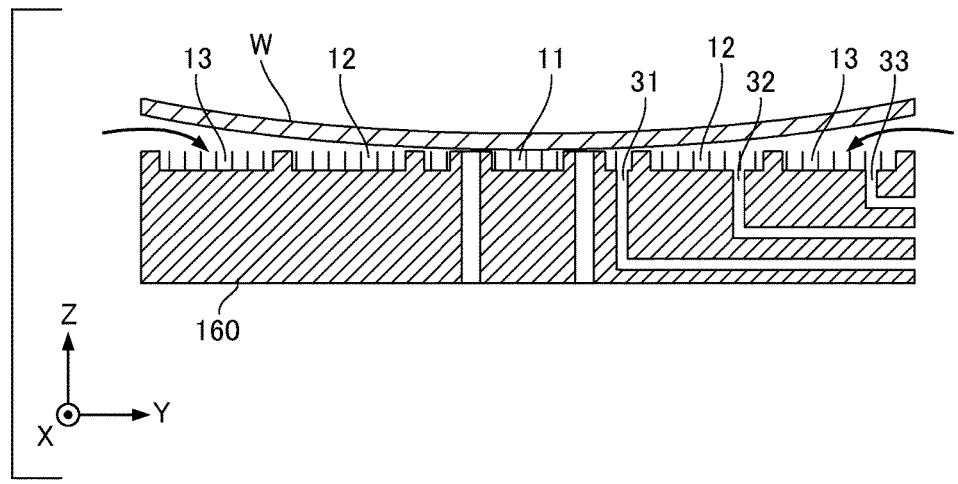
FIG. 4 illustrates a state where a downward-warped substrate is conveyed onto the attracting unit.

FIG. 4 illustrates a state where a downward-warped substrate W is conveyed onto the attracting unit 160. Arrows in FIG. 4 represent an air flow when air suction occurs in which the surrounding air is suctioned undesirably. If the total quantity (total attraction force) that can be suctioned by each vacuum attraction region is predetermined as a certain quantity, the air suction may also affect the vacuum attraction regions in which the air suction does not occur. In this case, it may be difficult to hold the substrate W tightly. Then, an additional configuration may be necessary in order to compensate the attraction force.

Figure 5:
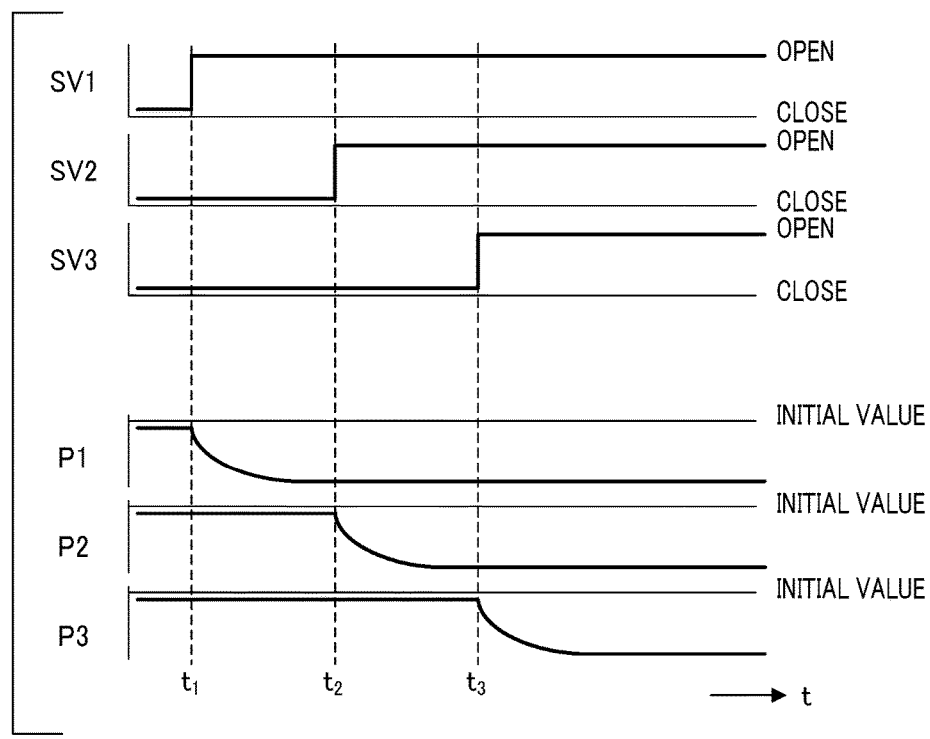
FIG. 5 illustrates timing for opening/closing solenoid valves and measurement results of pressure sensors.

FIG. 5 illustrates timing for opening/closing solenoid valves and pressure values. The timing and the pressure values shown in FIG. 5 are examples of timing suitable for attracting the downward-warped substrate W shown in FIG. 4, and time-dependent variation in pressure values that should be indicated by each pressure sensor in the case where the attraction is performed at this timing. Hereinafter, optimum timing refers to timing suitable for attracting the substrate W, and reference data (expected data) refers to data for determining whether the substrate W has been successfully attracted, from data about the time-dependent variation of pressure values that should be indicated by each pressure sensor in the case where the attraction is performed at the optimum timing. In FIG. 5, the lateral axis represents time. In upper graph in FIG. 5, the longitudinal axis represents opening or closing of the solenoid valves. In lower graph in FIG. 5, the longitudinal axis represents pressure values. Initial values refer to the pressure values if the time is zero. The optimum timing and the reference data shown in FIG. 5 are stored in a storage unit 152 in advance. If the substrate W has the downward-warped shape as shown in FIG. 4, it is desirable to sequentially proceed with attraction outward from the center of the substrate W. During a period to time $t_1$, the solenoid valves SV1 to SV3 are closed, and the pressure values indicated by the pressure sensor P1 to P3 maintain the initial values. As time passes to times $t_1$, $t_2$, and $t_3$, the solenoid valves SV1, SV2, and SV3 are opened sequentially to start the attraction in corresponding vacuum attraction regions 11, 12, and 13. In a period after the time $t_3$, all of the solenoid valves SV1 to SV3 are opened. As the solenoid valve SV1 is opened at the time $t_1$, the pressure value that should be indicated by the pressure sensor P1 starts to gradually decrease, and is then stabilized to a certain value at the time $t_2$ (the attraction is completed). At the time $t_2$, the solenoid valve SV2 is opened, the pressure value that should be indicated by the pressure sensor P2 starts to gradually decrease, and is then stabilized to a certain value at the time $t_3$. At the time $t_3$, the solenoid valve SV3 is opened, the pressure value that should be indicated by the pressure sensor P3 starts to gradually decrease, and is then stabilized to a certain value.

Figure 6:
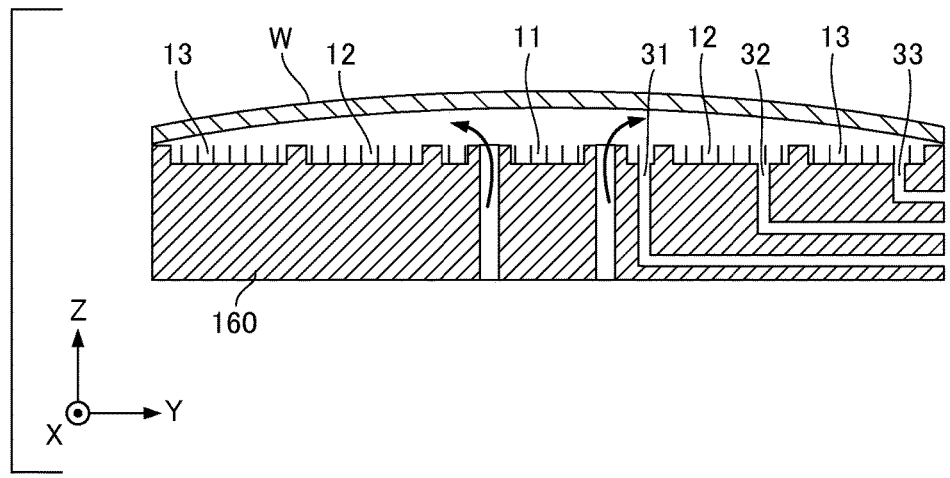
FIG. 6 illustrates a state where an upward-warped substrate is conveyed onto the attracting unit.

FIG. 6 illustrates a state where an upward-warped substrate W is conveyed onto the attracting unit 160. Arrows in FIG. 6 represent an air flow in a case where air suction occurs in which the surrounding air is suctioned undesirably.

Figure 7:
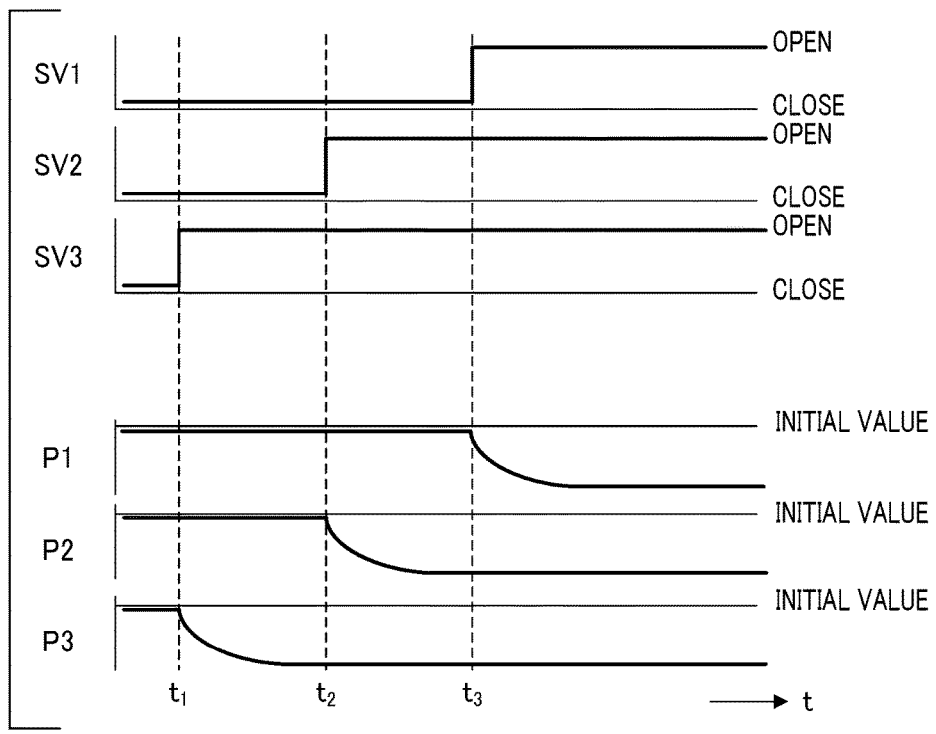
FIG. 7 illustrates timing for opening/closing the solenoid valves and measurement results of the pressure sensors.

FIG. 7 illustrates timing for opening/closing solenoid valves and measurement results of pressure sensors. The lateral and longitudinal axes in FIG. 7 are defined similarly to FIG. 5. The timing and the pressure values shown in FIG. 7 are examples of optimum timing and reference data corresponding to the upward-warped substrate W shown in FIG. 6, and are stored in the storage unit 152 similarly to the above description. If the substrate W has the upward-warped shape as shown in FIG. 6, it is desirable to sequentially proceed with attraction inward from the outside of the substrate W. During a period to time $t_1$, the solenoid valves SV1 to SV3 are closed and the pressure values indicated by the pressure sensor P1 to P3 maintain the initial values. As time passes to time $t_1$, $t_2$, and $t_3$, the solenoid valves SV3, SV2, and SV1 are opened sequentially to start the attraction in corresponding vacuum attraction regions 13, 12, and 11. In a period after the time $t_3$, all of the solenoid valves SV1 to SV3 are opened. As the solenoid valve SV3 is opened at the time $t_1$, the pressure value which should be indicated by the pressure sensor P3 starts to gradually decrease, and is then stabilized to a certain value at the time $t_2$. At the time $t_2$, the solenoid valve SV2 is opened, the pressure value which should be indicated by the pressure sensor P2 starts to gradually decrease, and is then stabilized to a certain value at the time $t_3$. At the time $t_3$, the solenoid valve SV1 is opened, the pressure value which should be indicated by the pressure sensor P1 starts to gradually decrease, and is then stabilized to a certain value.

The storage unit 152 stores optimum timing and reference data corresponding to the other shaped substrates, as well as the optimum timing and the reference data shown in FIGS. 5 and 7. The main control unit 150 sends one of the optimum timing (attraction sequences) stored in the storage unit 152 to the attraction control unit 170, and the attraction control unit 170 controls each component so as to vacuum-attract the substrate W based on this sequence. The attraction control unit 170 obtains pressure data (actual measurement data and measurement data) indicated by the pressure sensors P1 to P3 under the vacuum attraction based on this sequence to output the pressure data to the main control unit 150. The main control unit 150 compares the actual measurement data and the reference data, and determines whether the comparison result (evaluated value) satisfies a predetermined condition or not. If the comparison result satisfies the predetermined condition, the used attraction sequence is defined as optimum sequence.

The following equation 1 represents one example of evaluation values. If H is lower than a predetermined value in this equation 1, the used attraction sequence is determined as the optimum sequence. The predetermined condition may be decided based on a desired orientation for holding the substrate W.

$$H=\Sigma(|PM1t-PS1t|+|PM2t-PS2t|+|PM3t-PS3t|) \quad \text{(Equation 1)}$$

where PM1$t$ to PM3$t$ are the pressure values (actual measurement data) measured by the pressure sensors P1 to P3 at time t, PS1$t$ to PS3$t$ are the pressure values which should be indicated by the pressure sensors P1 to P3 at the time t, and t=1 . . . n.

Figure 8:
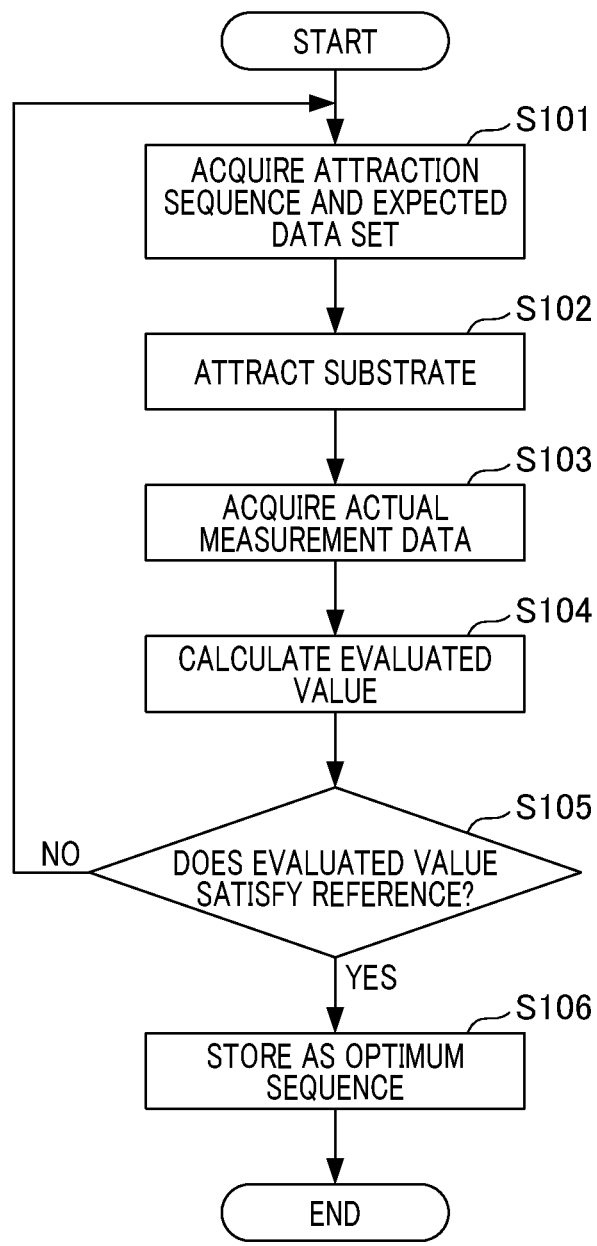
FIG. 8 is a flow chart of a vacuum attraction method with the holding device according to the first embodiment.

FIG. 8 is a flow chart of a vacuum attraction method with the holding device according to the present embodiment. In a step S101, the main control unit 150 acquires one pair (combination) of the attraction sequence and the pressure data (reference data) from the storage unit 152 and sends the pair to the attraction control unit 170. In a step S102, the main control unit 150 controls the substrate conveying hand (not shown) to place the substrate W onto the attraction unit 160. The attraction control unit 170 then controls the attraction unit 160 so as to start the attraction in the attraction sequence acquired in the step S101. In a step S103, the attraction control unit 170 obtains the pressure data (actual measurement data) indicated by the pressure sensors P1 to P3 to output the pressure data to the main control unit 150. In a step S104, the main control unit 150 compares the actual measurement data and the reference data to calculate the comparison result (evaluated value). In a step S105, the main control unit 150 determines whether or not the evaluated value satisfies the predetermined condition. If the evaluated value satisfies the predetermined condition (YES), in a step 106, the main control unit 150 stores the attraction sequence acquired in step S101 in the storage unit 152 as the optimum sequence. If the evaluated value does not satisfy the predetermined condition (NO), the operation returns to the step S101 and the main control unit 150 acquires another pair of the attraction sequence and the pressure data (reference data) from the storage unit 152 and the operation to the step S105 is performed again.

The substrate to be attracted in the first step S102 is prepared so as to have the same shape as that of the substrate to be used in device manufacture. For example, both substrates are selected from substrates in the same lot. The above operation is performed by using a first substrate in a lot, such that the optimum attraction sequence is determined to be stored in the storage unit 152. The attraction of second or more substrates in the lot is performed in the sequence stored in the storage unit 152.

As explained above, the holding device of the present embodiment can handle the attraction of substrates having a large variety of shapes by testing the attraction at some timing to determine the optimum attraction sequence. Additionally, this holding device can reduce the air suction, and thereby, for example, can achieve the improved throughput. According to the present invention, a holding device which is advantageous in holding a substrate that has a complex shape can be provided.

Second Embodiment

In the first embodiment, it is assumed that opening and closing of each solenoid valve are each performed once. However, there may be need to repeat the opening and closing of each solenoid valve due to the shape of the substrate (repeatedly attract). In this instance, as the total quantity that can be suctioned by each vacuum attraction region is predetermined as a certain quantity like the first embodiment, it may be difficult to attract the substrate with re-attraction. The present embodiment responds to this instance.

Figure 9:
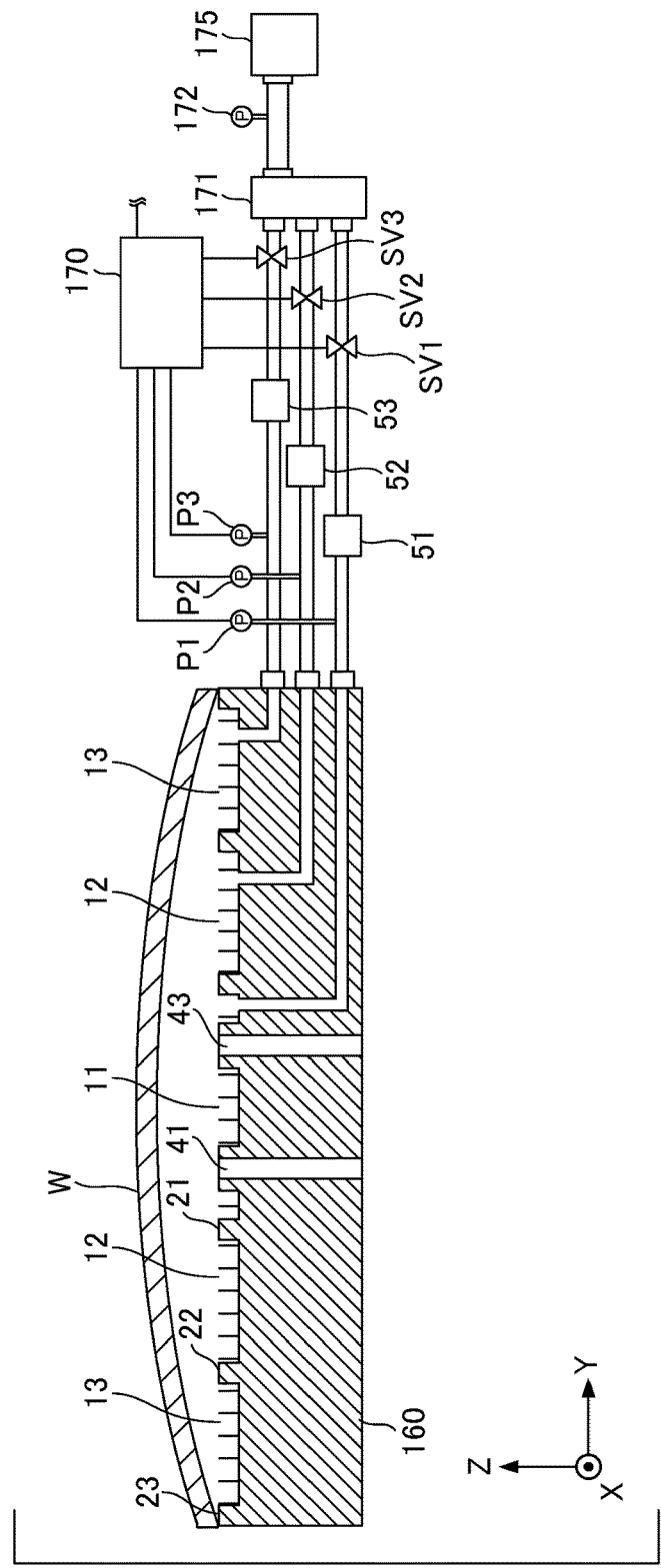
FIG. 9 is a general view of a holding device according to a second embodiment.

In the present embodiment, vacuum generators 51 to 53 are added to the attraction mechanism included in the attracting unit, and an air pump 175 is used instead of the vacuum pump 173 (FIG. 9). The discharging ports 31 to 33 are connected to the vacuum generators (ejectors) 51 to 53 via pipes. The vacuum generators 51 to 53 are connected to the solenoid valves SV1 to SV3 via pipes. The solenoid valves SV1 to SV3 are connected to the air pump 175 via the manifold 171. If the vacuum generators 51 to 53 are vacuum pumps, the solenoid valves SV1 to SV3 are configured to be on lines between the vacuum generators 51 to 53 and the discharging ports 31 to 33. Note that air supplied from plant facilities may be used, although the present embodiment employs the air pump 135. According to the attraction mechanisms of the present embodiment, a vacuum source is disposed for each of vacuum attraction regions 11 to 13, such that the vacuum attraction in each of the vacuum attraction regions 11 to 13 can be made independent, and thereby it can be minimized to extend the decrease in the attraction force due to air leak to other regions. That is, the substrate can be attracted and held with re-attraction (re-peated attraction) in which the attraction started in the vacuum attraction regions 11 to 13 stops, and then starts again.

Figure 10:
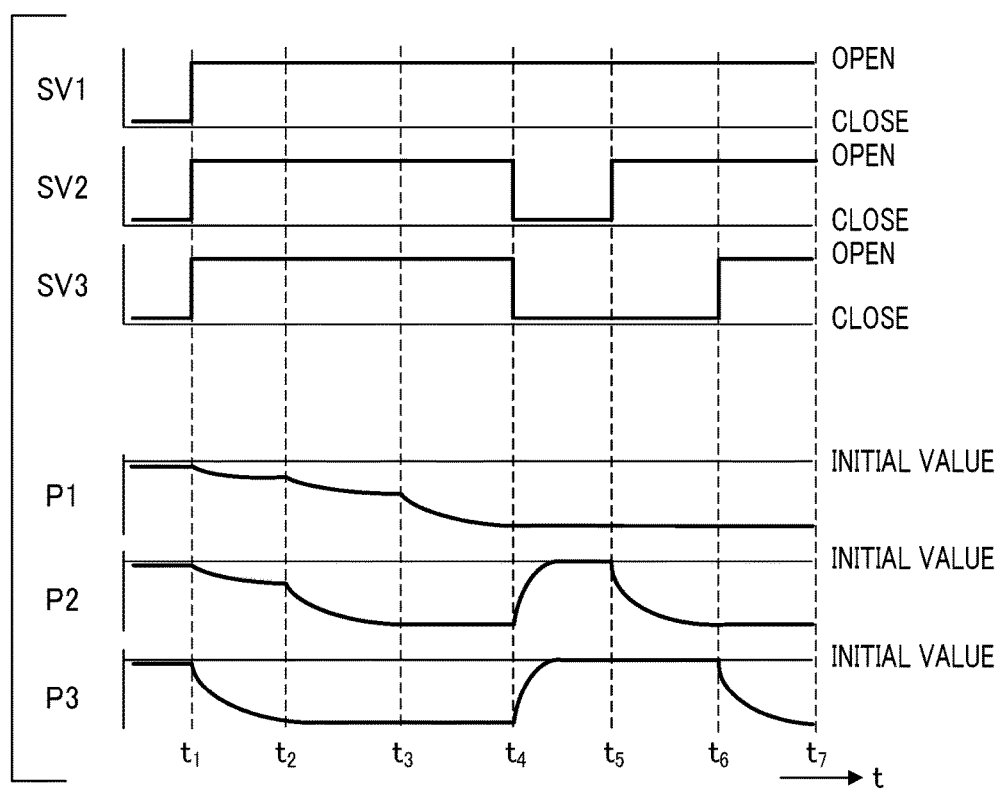
FIG. 10 illustrates timing for opening/closing solenoid valves and measurement results of pressure sensors.
Figure 11:
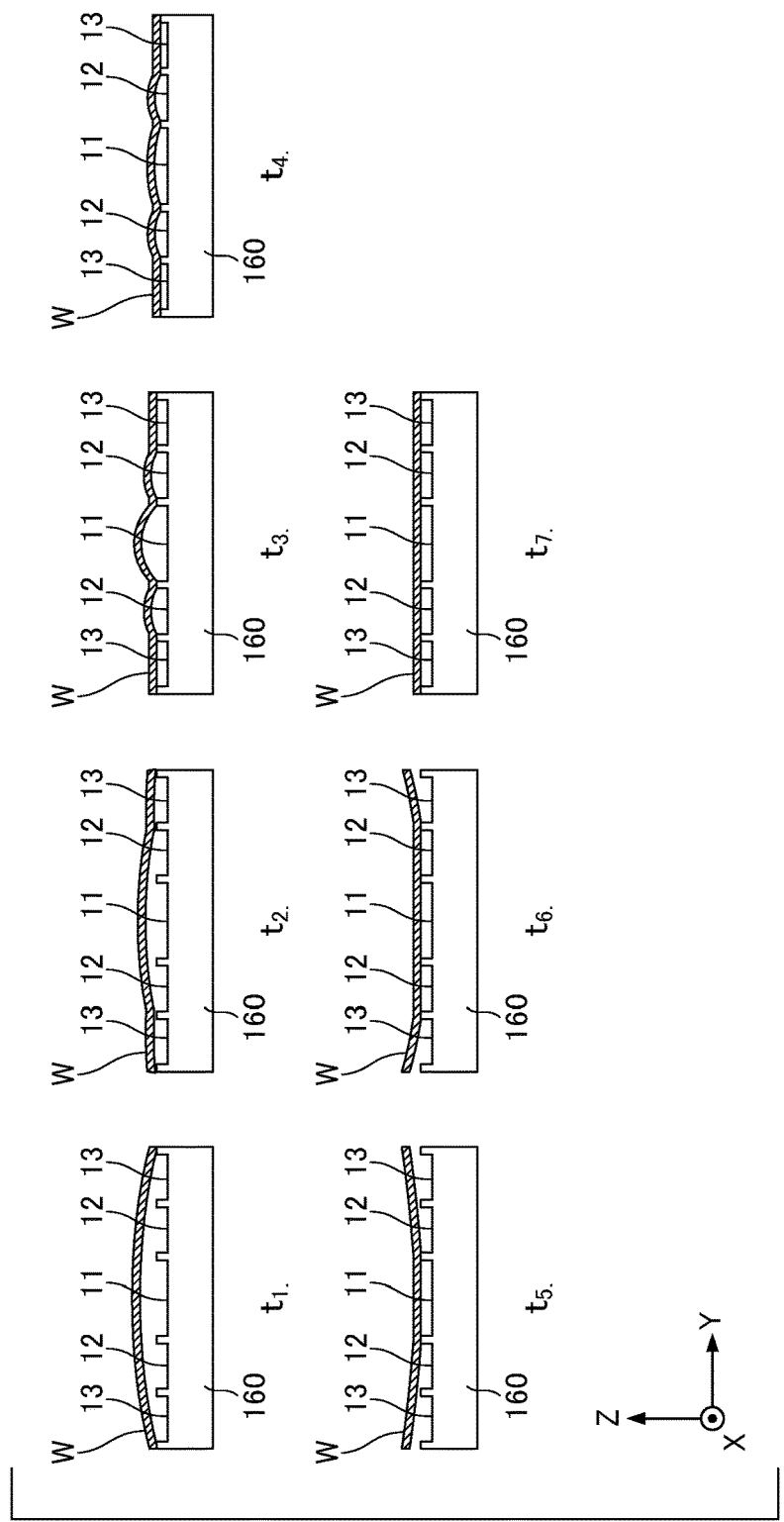
FIG. 11 represents shapes of a substrate at each time point, in the case where attraction is performed based on the timing shown in FIG. 10.

FIG. 10 illustrates timing for opening/closing solenoid valves and pressure values. Each axis is defined similarly to FIGS. 5 and 7. The timing and the pressure values shown in FIG. 10 are examples of optimum timing and reference data corresponding to the upward-warped substrate W. FIG. 11 represents shapes of the substrate W at each time shown in FIG. 10. In the present embodiment, after the entire substrate W is attracted by one operation, the attraction is temporarily stopped in the outer side of the substrate W, and then the attraction sequentially proceeds outward from the region near the center of the substrate W. Note that the present embodiment starts the attraction in each attraction region concurrently, but is not limited thereto.

During a period to time $t_1$, the solenoid valves SV1 to SV3 are closed and the pressure values indicated by the pressure sensor P1 to P3 maintain the initial values. At the time $t_1$, the solenoid valves SV1 to SV3 are opened to start the attraction in the vacuum attraction regions 11 to 13. The pressure values that should be indicated by each pressure sensor are gradually decreased to become stabilized at certain values at time $t_4$. Referring to FIG. 11, the substrate W has insufficient flatness at the time $t_4$, as stress is accumulated in the vacuum attraction region 11. Thus, the solenoid valve SV2 and the solenoid valve SV3 are closed at the time $t_4$. The vacuum attraction region 11 then maintains the attraction, and thereby, the substrate W becomes a floating state from the attracting unit 160 on the vacuum attraction regions 12 and 13, at time $t_5$. In this time, according to the attraction mechanisms of the present embodiment, the air leak at the vacuum attraction regions 12 and 13 can be reduced to affect the vacuum attraction region 11. Subsequently, at the time $t_5$, the solenoid valve SV2 is opened to start the attraction in the vacuum attraction region 12. At time $t_6$, the solenoid valve SV3 is opened to start the attraction in the vacuum attraction region 13. This holds the substrate W with satisfactory flatness as shown at time $t_7$ in FIG. 11.

Figure 12:
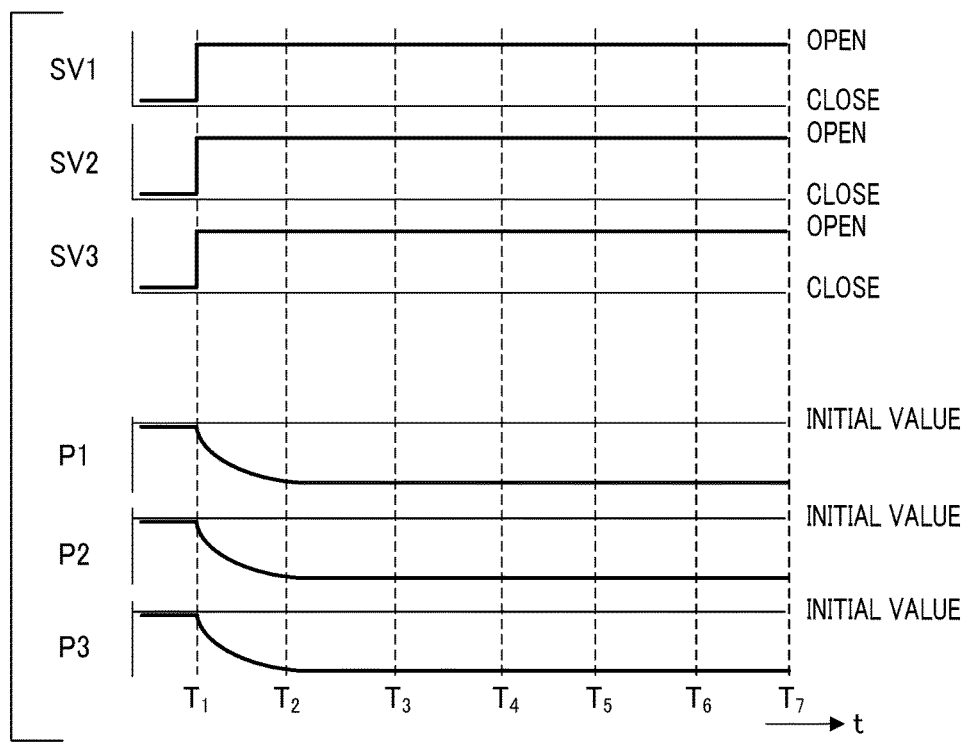
FIG. 12 illustrates reference data in the case where a substrate without any warp is attracted.

A description will be given of a method for determining whether re-attraction (at and after time $t_4$) of the substrate W is performed or not. FIG. 12 illustrates reference data in a case where the substrate W without any warp starts to be attracted concurrently by using each attraction region. Each axis is defined similarly to FIG. 10. In FIG. 12, the attraction starts at time $T_1$, and pressure values become certain values at time $T_2$ to complete attracting and holding the substrate W. The flatness is estimated from the evaluated value that is calculated with the reference data at the time $T_1$ and $T_2$ and the equation 1 of the first embodiment. If it is determined that the flatness is insufficient, the re-attraction of the substrate W is performed.

Figure 13:
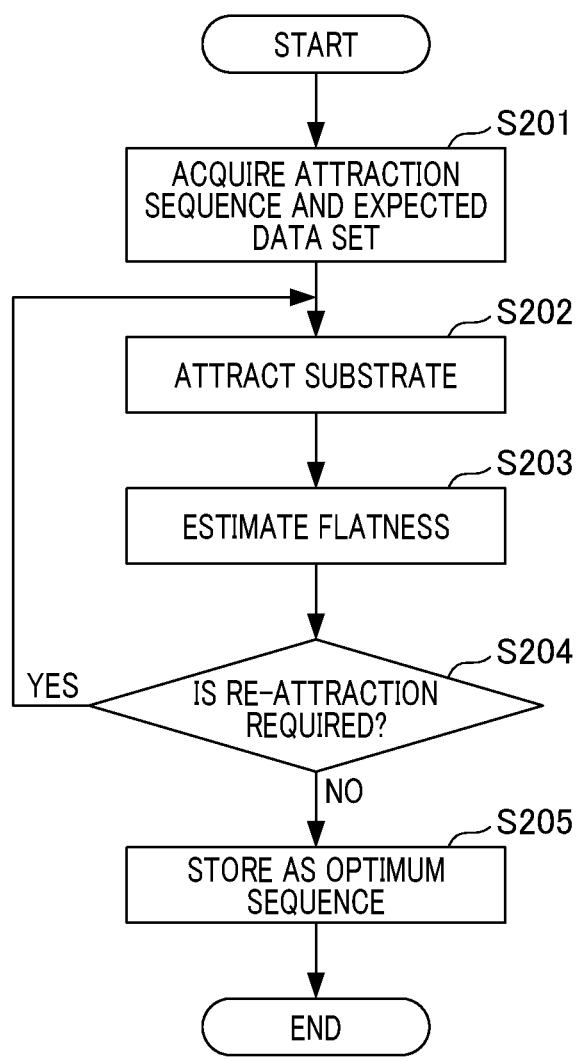
FIG. 13 is a flow chart of a vacuum attraction method with the holding device according to the second embodiment.

FIG. 13 is a flow chart of a vacuum attraction method with the holding device according to the second embodiment. In a step S201, the main control unit 150 acquires a pair (combination) of the attraction sequence (including the re-attraction sequence) and the pressure data (reference data) from the storage unit 152 and sends the pair to the attraction control unit 170. In a step S202, the main control unit 150 controls the substrate conveying hand (not shown) to place the substrate W onto the attracting unit 160. The attraction control unit 170 then controls the attracting unit 160 to start the attraction in the acquired attraction sequence. In a step S203, when the pressure sensors P1 to P3 indicate certain values as the pressure data, the attraction control unit 170 outputs this pressure data (actual measurement data) of the pressure sensors P1 to P3 to the main control unit 150. The main control unit 150 compares the actual measurement data, for example, with the reference data to estimate the flatness of the substrate W. In a step S204, the main control unit 150 determines whether the re-attraction is required or not, based on the estimated flatness. If the re-attraction is not required (NO), in a step S205, the main control unit 150 stores the attraction sequence (not including the re-attraction sequence) in the storage unit 152 as optimum sequence. If the re-attraction is required, the attraction control unit 170 causes the attracting unit 160 to start attraction in re-attraction sequence acquired in the step S201, and the operation in and after the step S203 is repeated. In this case, the storage unit 152 stores the optimum sequence that also includes the re-attraction sequence, in the step S205.

As explained above, the holding device of the present embodiment can re-attract a substrate by independent attraction mechanisms to handle attraction of substrates having a larger variety of shapes. According to the present embodiment, the same effects can also be obtained as those of the first embodiment.

The storage unit 152 may store the attraction sequence and the pressure data for each level of warp contemplated for the substrate, or otherwise the storage unit 152 may store relational expressions about any or all of attraction sequence and pressure data such that the main control unit 150 may calculate the attraction sequence and the pressure data using this relational expression, if required. Additionally, the flatness of the attracted substrate may be evaluated on the basis of a time difference between the time in which attraction is completed in a vacuum attraction region near the center of the substrate W and time in which attraction is completed in a vacuum attraction region apart from the center of the substrate W. Otherwise, the flatness of the attracted substrate may also be evaluated on the basis of the time until the pressure reaches a predetermined value. Furthermore, the flatness of the substrate W may be measured with a sensor (measuring unit) not shown, such that the flatness may also be evaluated on the basis of the measured result. In addition, the storage unit 152 may be included in the main control unit 150.

The reference data may be pressure data in a case where the substrate can be attracted and held with satisfactory flatness in the attraction performed in pre-set optimum sequence actually, and may be pressure data calculated based on the shape of the substrate or the like.

Embodiment of Article Manufacturing Method

An article manufacturing method according to an embodiment of the present invention is preferred in manufacturing an article, for example, a micro device such as a semiconductor device or the like or an article such as an (optical) element or the like having a microstructure. The article manufacturing method of the present embodiment may include a step of forming (exposing) a pattern on a substrate held by the aforementioned holding device using the aforementioned exposure apparatus; and a step of processing (developing) the substrate on which the pattern has been formed in the previous step. If the lithography apparatus is an imprint apparatus, the article manufacturing method includes, for example, a step of removing a residual film instead of the developing step. Furthermore, the article manufacturing method may include other known steps (oxidizing, film forming, vapor depositing, doping, flattening, etching, resist peeling, dicing, bonding, packaging, and the like). The article manufacturing method of the present embodiment has an advantage, as compared with a conventional article manufacturing method, in at least one of performance, quality, productivity and production cost of an article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-061983, filed Mar. 25, 2016, which is hereby incorporated by reference wherein in its entirety.

What is claimed is:

1. A holding device for holding a substrate, the holding device comprising:
   an attracting unit having attraction mechanisms configured to vacuum-attract the substrate;
   a first measuring unit configured to measure pressure in the attracting mechanisms; and
   a control unit configured to:
      acquire reference data that includes time-dependent variation in pressure in the attraction mechanisms as a reference, in a case where the attraction mechanisms vacuum-attract the substrate based on a first sequence that indicates a sequence of the attraction mechanisms that start vacuum-attracting the substrate;
      control the attraction mechanisms to vacuum-attract a first substrate based on the first sequence;
      control the first measuring unit to measure pressure in the attraction mechanisms while vacuum-attracting the first substrate based on the first sequence and acquire measurement data that indicates time-dependent variation in the measured pressure;
      acquire a comparison result by comparing the reference data and the measurement data and determine whether the comparison result satisfies a predetermined condition;
      control the attraction mechanisms, in a case where the comparison result satisfies the predetermined condition, to vacuum-attract a second substrate based on the first sequence; and
      control the attraction mechanism, in a case where the comparison result does not satisfy the predetermined condition, to vacuum-attract the second substrate based on a second sequence different from the first sequence.

2. The holding device according to claim 1, wherein the control unit is configured to acquire a combination of the first sequence and the reference data.

3. The holding device according to claim 1, wherein the control unit is configured to acquire, as the reference data, data representing relation between the pressure and time in a case where a substrate is attracted by the attracting unit.

4. The holding device according to claim 1, wherein the control unit is configured to acquire a relational expression as the reference data, the relational expression representing relation between the pressure and time.

5. The holding device according to claim 1, wherein the predetermined condition is defined on a basis of a time difference between time in which one of the attraction mechanisms completes attraction and time in which another of the attraction mechanisms farther from a center of the substrate than the one completes attraction.

6. The holding device according to claim 1, wherein the predetermined condition is defined on a basis of time until the pressure reaches in a predetermined pressure.

7. The holding device according to claim 1, further comprising:

a second measuring unit configured to measure flatness of the substrate,
wherein the predetermined condition is defined on a basis of a measurement result of the flatness of the substrate measured by the second measuring unit.

8. The holding device according to claim 2, wherein:
the combination is prepared in a plurality of kinds depending on a shape of the substrate, and
the control unit is configured to acquire the plurality of kinds of the combination.

9. The holding device according to claim 1, wherein the first sequence and the second sequence include re-attraction sequence where the attraction started in the vacuum attraction regions stops, and starts again.

10. The holding device according to claim 9, wherein the attracting unit comprises respective vacuum sources disposed for respective attraction mechanisms.

11. The holding device according to claim 9, wherein the control unit is configured to control the attracting unit based on the re-attraction sequence to acquire the measurement data, in a case where the comparison result does not satisfy the predetermined condition, which is obtained by controlling the attracting unit based on a sequence not including the re-attraction sequence.

12. The holding device according to claim 1, wherein the first substrate and the second substrate are selected from among substrates having the same shape.

13. The holding device according to claim 1, wherein the first substrate and the second substrate are selected from substrates in the same lot.

14. A holding method of holding a substrate with attracting mechanisms configured to vacuum-attract the substrate, the holding method comprising the steps of:
acquiring reference data that includes time-dependent variation in pressure in the attraction mechanisms as a reference, in a case where the attraction mechanisms vacuum-attract the substrate based on a first sequence that indicates a sequence of the attraction mechanisms that start vacuum-attracting the substrate;
controlling the attraction mechanisms to vacuum-attract a first substrate based on the first sequence:
measuring pressure in the attraction mechanisms while vacuum-attracting the first substrate based on the first sequence and acquiring measurement data that indicates time-dependent variation in the measured pressure;
acquiring a comparison result by comparing the reference data and the measurement data and determining whether the comparison result satisfies a predetermined condition;
controlling the attraction mechanisms, in a case where the comparison result satisfies the predetermined condition, to vacuum attract a second substrate based on the first sequence; and
controlling the attraction mechanisms, in a case where the comparison result does not satisfy the predetermined condition, to vacuum attract the second substrate based on a second sequence different from the first sequence.

15. A lithography apparatus for forming a pattern on a substrate, the lithography apparatus comprising:
a stage; and
a holding device that holds the substrate and comprises:
an attracting unit having attraction mechanisms configured to vacuum-attract the substrate;
a first measuring unit configured to measure pressure in the attracting mechanisms; and
a control unit configured to:
acquire reference data that includes time-dependent variation in pressure in the attraction mechanisms as a reference, in a case where the attraction mechanisms vacuum-attract the substrate based on a first sequence that indicates a sequence of the attraction mechanisms that start vacuum-attracting the substrate;
control the attraction mechanisms to vacuum-attract a first substrate based on the first sequence;
control the first measuring unit to measure pressure in the attraction mechanisms while vacuum-attracting the first substrate based on the first sequence and acquire measurement data that indicates time-dependent variation in the measured pressure; and
acquire a comparison result by comparing the reference data and the measurement data and determine whether the comparison result satisfies a predetermined condition;
control the attraction mechanisms, in a case where the comparison result satisfies the predetermined condition, to vacuum-attract a second substrate based on the first sequence; and
control the attraction mechanism, in a case where the comparison result does not satisfy the predetermined condition, to vacuum-attract the second substrate based on a second sequence different from the first sequence.

16. A method of manufacturing an article, the method comprising the steps of:
forming a pattern on a substrate using a lithography apparatus; and
processing the substrate on which the pattern is formed in the forming step,
wherein the lithography apparatus comprises:
a stage; and
a holding device for holding the substrate and comprising:
an attracting unit having attraction mechanisms configured to vacuum-attract the substrate;
a first measuring unit configured to measure pressure in the attracting mechanisms; and
a control unit configured to:
acquire reference data that includes time-dependent variation in pressure in the attraction mechanisms as a reference, in a case where the attraction mechanisms vacuum-attract the substrate based on a first sequence that indicates a sequence of the attraction mechanisms that start vacuum-attracting the substrate;
control the attraction mechanisms to vacuum-attract a first substrate based on the first sequence;
control the first measuring unit to measure pressure in the attraction mechanisms while vacuum-attracting the first substrate based on the first sequence and acquire measurement data that indicates time-dependent variation in the measured pressure; and
acquire a comparison result by comparing the reference data and the measurement data and determine whether the comparison result satisfies a predetermined condition;
control the attraction mechanisms, in a case where the comparison result satisfies the predetermined condition, to vacuum-attract a second substrate based on the first sequence; and control the attraction mechanism, in a case where the comparison result does not satisfy the predetermined condition, to vacuum-attract the second substrate based on a second sequence different from the first sequence.

* * * * *